United States Patent
Kim et al.

(10) Patent No.: US 6,774,543 B2
(45) Date of Patent: Aug. 10, 2004

(54) HEAT DISSIPATING PLASMA DISPLAY DEVICE

(75) Inventors: Ki-Jung Kim, Ahsan (KR); Guy-Sung Kim, Suwon (KR); Ki-Yun Joung, Cheonan (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/200,779

(22) Filed: Jul. 23, 2002

(65) Prior Publication Data

US 2003/0025427 A1 Feb. 6, 2003

(30) Foreign Application Priority Data

Aug. 3, 2001 (KR) .......................................... 2001-47073

(51) Int. Cl.[7] .................................................. H01K 1/58
(52) U.S. Cl. .............................. 313/46; 313/11; 362/294
(58) Field of Search .......................... 362/294; 313/11, 313/25, 44, 582, 583, 584, 585, 586, 587, 46; 165/168, 169, 170

(56) References Cited

U.S. PATENT DOCUMENTS 5,971,566 A * 10/1999 Tani et al. .................. 362/294

6,373,702 B2 * 4/2002 Oishi et al. ................. 361/704

FOREIGN PATENT DOCUMENTS

| JP | 10-040823 | 2/1998 |
|----|-----------|--------|
| JP | 10-172146 | 6/1998 |
| JP | 10-251372 | 9/1998 |
| JP | 11-65485 | 3/1999 |
| KR | 2000-0074192 | 12/2000 |

OTHER PUBLICATIONS

Patent Abstract of Japan, Publication No. 11–065485, Published on Mar. 5, 1999, in the name of Inoue Hiroto, et al.

Korean Patent Abstract, Publication No. 1020000074192, Published on Dec. 15, 2000, in the name of Eun, et al.

* cited by examiner

Primary Examiner—Edward J. Glick
Assistant Examiner—Elizabeth Keaney
(74) Attorney, Agent, or Firm—Christie, Parker & Hale, LLP

(57) ABSTRACT

A plasma display device including a plasma display panel, a chassis base disposed in parallel with the plasma display panel, and a heat conductive media disposed between the plasma display panel and the chassis base. The heat conductive media is disposed such that a heat conductive rate is varied according to a location of the plasma display panel or the chassis base.

15 Claims, 4 Drawing Sheets

HEAT DISSIPATING PLASMA DISPLAY DEVICE

CROSS-REFERENCE TO RELATED APPLICATIONS

This application claims priority to and the benefit of Korean Application No. 2001-47073, filed on Aug. 3, 2001 in the Korean Patent Office, the entire disclosure of which is incorporated herein by reference.

FIELD OF THE INVENTION

The present invention relates to a plasma display device, and more particularly, to a plasma display device with means for dissipating heat generated in a plasma display panel.

BACKGROUND OF THE INVENTION

As is well known, a plasma display device uses discharge gas to realize an image. The discharge gas causes heat to be generated in a plasma display panel (PDP) on which the image is realized. Furthermore, when the discharge intensity is increased to improve the brightness, the heat generated in the plasma display panel is also further increased. Therefore, it is important to dissipate the heat out of the device.

Accordingly, the PDP is generally mounted on a chassis base having a high heat conductive property with a heat spreading sheet (or a heat conductive sheet) disposed therebetween so that the heat generated in the PDP can be dissipated through the chassis base and the heat spreading sheet. The chassis base can be formed by a die casting or press process with metal such as aluminum. The heat spreading sheet can be formed of a silicon resin.

Japanese laid-open Patent Nos. 10-40823 and 10-254372 disclose such a plasma display device.

To further improve the heat dissipating efficiency, it is important to effectively mount the heat spreading sheet. That is, the heat spreading sheet should be closely attached to both the PDP and the chassis base to increase the heat conductive efficiency.

However, when the chassis base is formed by the die casting process, it may not be formed in a complete flat state, but be partly round. Therefore, when the heat spreading sheet is attached to the rounded portion, air may be formed in a space between the contact surfaces of the chassis base and the heat spreading sheet.

Accordingly, when the air is formed in the space between the contact surfaces of the chassis base and the heat spreading sheet, heat dissipation becomes deteriorated due to the air. This problem may occur at the contact portion between the PDP and the heat spreading sheet as well as at the contact portion between the chassis base and the heat spreading sheet.

To overcome the above problems, Japanese laid-open Patent No. 10-172446 discloses a plasma display device in which an absorbing member is disposed enclosing the periphery of a PDP and liquid heat conductive media is injected into a space enclosed by the absorbing member and solidified. A display panel is attached on the solidified heat conductive media to improve the heat dissipating efficiency.

However, since the plasma display panel is generally mounted in a vertical direction, the heat generated on the upper portion of the device becomes naturally higher than the heat generated on the lower portion of the device. Therefore, the heat conductive means disposed between the PDP and the chassis should be disposed considering the heat distribution. In the prior art, however, because the heat conductive media is uniformly disposed without considering the heat distribution, the heat dissipation cannot be effectively realized throughout the entire area of the PDP.

Therefore, the present invention has been made in an effort to solve the above-described problems.

SUMMARY OF THE INVENTION

In accordance with the present invention, a plasma display device is provided that can effectively dissipate the heat generated in the PDP regardless of the structures of the chassis base and the PDP and the heat generation distribution of the PDP.

An embodiment of the present invention plasma display device includes a plasma display panel, a chassis base disposed in parallel with the plasma display panel, and a heat conductive media disposed between the plasma display panel and the chassis base. The heat conductive media is disposed such that a heat conductive rate is varied according to a location of the plasma display panel or the chassis base.

According to an embodiment of the present invention, the heat conductive media includes a plurality of heat conductive members disposed at a predetermined distance. The heat conductive members are disposed along a plurality of rows in parallel with each other, a distance between adjacent heat conductive members being different according to the rows. The distance is increasingly increased from an initial row to a last row, and an amount of each member is identical. Alternatively, the heat conductive members are disposed along a plurality of rows in parallel with each other, a distance between adjacent heat conductive members being identical. An area of the heat conductive members is increasingly decreased from an initial row to a last row.

According to still another embodiment of the present invention, the heat conductive media is formed of a single layer disposed between the plasma display panel and the chassis base. A thickness of the single layer is different from one end of the plasma display panel or the chassis base to the other end of the plasma display panel or the chassis base. The thickness is increasingly reduced from the one end to the other end.

The plasma display device may further include a spacer disposed between the plasma display panel and the chassis base to maintain a space between the plasma display panel and the chassis base. As an example, the spacer can be disposed at each corner between the plasma display panel and the chassis base. As another example, the spacer can be formed in a band-shape disposed around the periphery between the plasma display panel and the chassis base. The spacer can formed of a double-faced tape. A plurality of projections can be formed on a surface of the chassis base, on which the heat conductive media is attached.

DETAILED DESCRIPTION OF THE INVENTION

Figure 1:
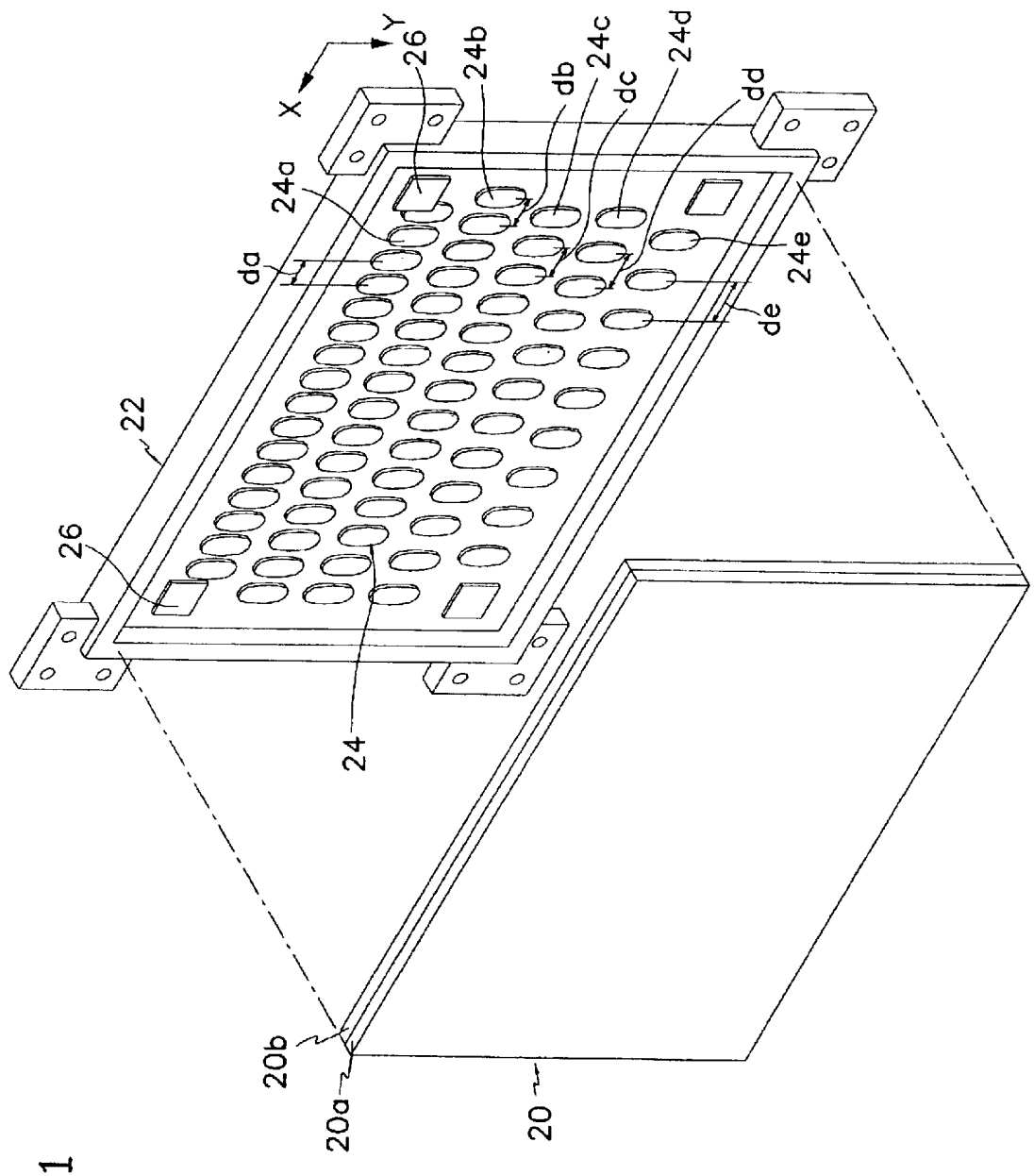
FIG. 1 is an exploded perspective view of a plasma display device according to a first embodiment of the present invention.
Figure 2:
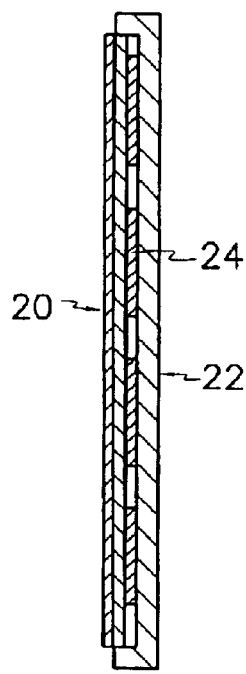
FIG. 2 is a side sectional view of an assembled plasma display device depicted in FIG. 1.

FIGS. 1 and 2 show a plasma display device according to a first embodiment of the present invention.

As shown in the drawings, the inventive plasma display device includes PDP 20 formed of two glass substrates 20a and 20b to realize an image, chassis base 22 fixedly disposed on a rear surface of PDP 20, and heat conductive media 24 disposed between PDP 20 and chassis base 22 to transmit heat generated in PDP 20 to chassis base 22. Although, front and back cases are disposed to encase PDP 20 and chassis base 22, these elements are omitted in the drawings for the convenience of the description.

Generally, PDP 20 is formed in a rectangular-shape, and chassis base 22 is formed by a material having a high heat conductive property, such as aluminum. Further, a circuit part (not shown) for driving the plasma display device is mounted on a surface of chassis base 22, and PDP 20 is mounted on the other surface which is opposite the surface thereof.

In addition, heat conductive media 24 dissipates the heat generated in PDP 20 out of the device through chassis base 22. At this point, heat conductive media 24 is disposed between chassis base 22 and PDP 20 such that the heat conductive rate becomes different at each location of chassis base 22.

Describing the structure of heat conductive media 24 more in detail, as shown in FIG. 1, heat conductive media 24 is composed of a plurality of groups of heat conductive members 24a, 24b, 24c, 24d, and 24e disposed along first to fifth rows from the upper side to the low side of PDP 20. The heat conductive members of each group are spaced away from each other at a predetermined distance in the longitudinal direction X of PDP 20. The distance d between centers of adjacent heat conductive members disposed along the first to fifth rows is increasingly increased as it goes in the lateral direction Y of PDP 20 from first to fifth rows.

That is, when the distance of adjacent heat conductive members 24a disposed along the first row is $d_a$, the distances $d_b$, $d_c$, $d_d$, and $d_e$ of adjacent heat conductive members 24b, 24c, 24d and 24e are increasingly increased to be more than the distance $d_a$.

The above-described structure of heat conductive media 24 takes into consideration that the heat generated on the upper portion of chassis base 22 is higher than that generated on the lower portion of chassis base 22.

That is, when the plasma display device realizes an image with the above described heat conductive media 24, the temperature of the heat generated on the upper portion of PDP 20 is higher than that generated on the lower portion of PDP 20 due to the natural heat transmission.

Accordingly, considering the above described heat distribution, the number of heat conductive members of conductive media 24 at the upper portion of chassis base 22 is greater than that of the conductive member at the lower portion of chassis base 22 such that the heat generated in PDP 20 can be more effectively dissipated.

The arrangement of heat conductive members 24b, 24c, 24d and 24e by the adjustment of the distance between the centers of the heat conductive members is only an example for adjusting the heat conductive rate at each portion of heat conductive media 24. The arrangement of the heat conductive members is realized according to the following method. Heat conductive media 24 is formed of liquid material such as gel that can be hardened through a hardening process. In this embodiment, heat conductive media 24 is pre-formed in the above-described arrangement by injecting liquefied silicon resin (i.e., Gap Filler 1000, trademark of Bergquist company). When the liquefied silicon resin is injected through a machine having an injector, an injecting volume corresponding to each conductive member is identical. After forming heat conductive media 24, PDP 20 and chassis base 22 are aligned, and pre-formed media 24 is hardened. Since heat conductive media 24 is disposed between PDP 20 and chassis base 22 in the above-described arrangement, the heat conductive rate at the upper portion of the device becomes higher than that at the lower portion of the device. Accordingly, the heat dissipation is realized in response to the heat generating distribution of PDP 20.

In addition, spacers 26 supporting a gap between PDP 20 and chassis base 22 may be further disposed between PDP 20 and chassis base 22. In this embodiment, as shown in FIG. 1, spacers 26 are disposed at the corners of chassis base 22. At this point, the thickness of spacer 26 is designed having a thickness identical to that of hardened heat conductive members 24a–24e. At this point, when spacers 26 are formed with adhesive on both surfaces, the coupling force between PDP 20 and chassis base 22 may be enhanced.

Figure 3:
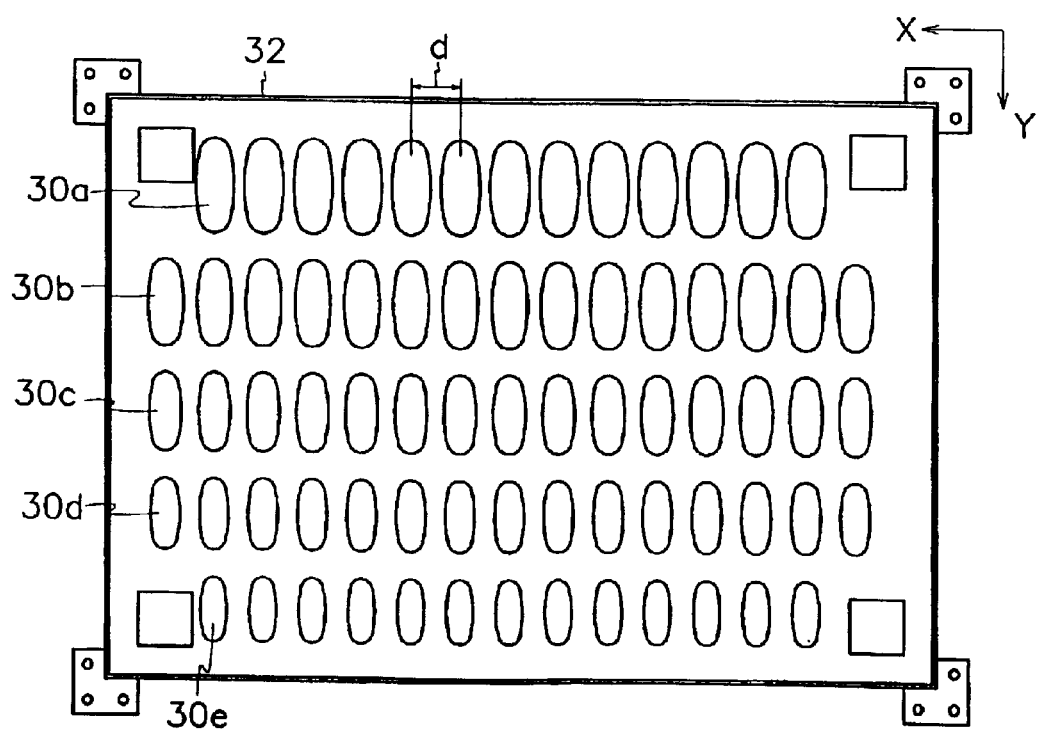
FIG. 3 is a front view of a plasma display device according to a second embodiment of the present invention, in which a heat conductive media is coupled on a chassis base.

FIG. 3 shows a second embodiment of the present invention.

As shown in the drawing, heat conductive media 30 is formed of a plurality of groups of heat conductive members 30a, 30b, 30c, 30d and 30e. The heat conductive members of each group are arranged along a row in a longitudinal direction X of chassis base 32. The distance d between the adjacent conductive members of each group is identical.

At this point, the areas of heat conductive members 30a–30e are increasingly decreased as they go from the upper row to the low row in a lateral direction Y of the chassis. This structure takes into consideration the heat generating distribution of the PDP. The variation of the areas is realized by adjusting the injection amount of liquid silicon resin on chassis base 32.

After forming heat conductive media 30 on chassis base 32, chassis base 32 and the PDP (not shown) are assembled. Since the area of the heat conductive media at the upper portion of the PDP is greater than that at the lower portion of the PDP, the heat generated in the PDP can be effectively dissipated.

Needless to say, in this second embodiment, the heat conductive media may be formed on the PDP instead of the chassis, and spacers can also be disposed as in the first embodiment.

Figure 4:
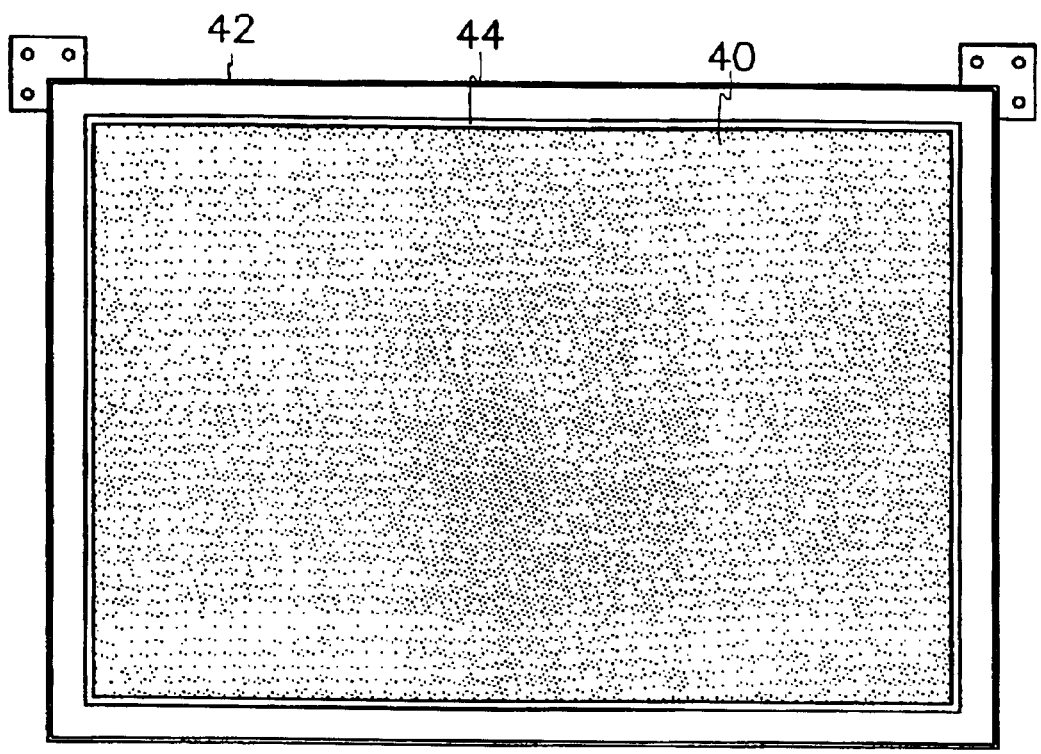
FIG. 4 is a front view of a plasma display device according to a third embodiment of the present invention, in which a heat conductive media is coupled on a chassis base.

FIG. 4 shows a third embodiment of the present invention.

As shown in the drawing, a single layer of heat conductive media 40 is disposed on chassis base 42. At this point, in response to the heat generating distribution of the PDP, heat conductive media 40 has a thickness, which is gradually reduced as it goes from the upper portion to the lower portion of the PDP. That is, by adjusting the thickness of the heat conductive media 40, the heat conductive rate at each portion of the PDP can be varied.

That is, when a portion of the layer is relatively thicker than other portions, this portion has a relatively higher heat conductive rate, and a portion of the layer is relatively thinner than other portions, this portion has a relatively lower heat conductive rate. Accordingly, as the thickness of the layer of the heat conductive media at the upper portion of the PDP is greater than the lower portion, the heat generated in the PDP can be effectively dissipated.

The adjustment of the thickness according to the portion of heat conductive media 40 can be easily realized by adjusting the shape of spacer 44 on the periphery of heat conductive media 40.

Figure 5:
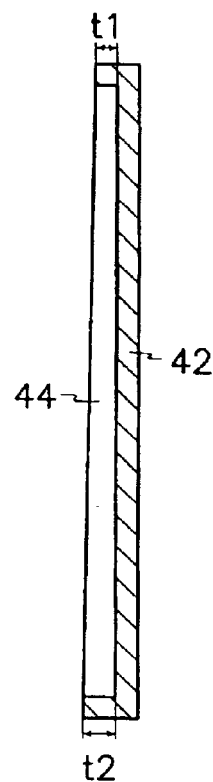
FIG. 5 is a side sectional view of a plasma display device according to a third embodiment of the present invention, showing a spacer.

Describing the third embodiment more in detail, spacer 44 is disposed to maintain the gap between the PDP and chassis base 42, and as shown in FIG. 5, is formed in a band-shape having a thickness that is increased as it goes from the upper portion to the lower portion. That is, thickness t1 at the upper portion of the PDP or chassis base 42 is less than thickness t2 at the lower portion of the PDP or chassis base 42.

Figure 6:
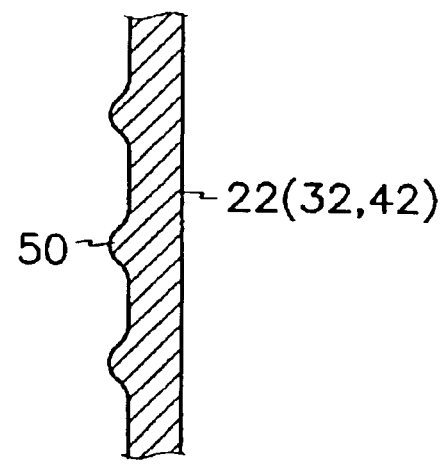
FIGS. 6 and 7 show partial side sectional views illustrating modified examples of the plasma display device of the present invention.
Figure 7:
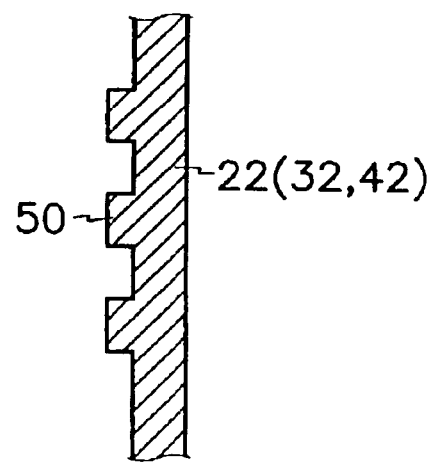

Referring to FIGS. 6 and 7, in accordance with the present invention, a plurality of projections 50 may be formed on a front surface of chassis base 22 (32 or 42) to enlarge the attaching area of heat conductive media 24 (30 or 40) to chassis base 22 (32 or 42).

As examples, as shown in FIG. 6, the projection may be formed in an embossing-shape or as shown in FIG. 7, formed in an unevenness surface.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device comprising:
   a plasma display panel;
   a chassis base disposed in parallel with the plasma display panel; and
   a heat conductive media disposed between the plasma display panel and the chassis base,
   wherein the heat conductive media is disposed such that a heat conductive rate is varied according to a location on the plasma display panel or the chassis base.

2. The plasma display device of claim 1 wherein the heat conductive media includes a plurality of heat conductive members disposed at a predetermined distance.

3. A plasma display device comprising:
   a plasma display panel;
   a chassis base disposed in parallel with the plasma display panel; and
   a heat conductive media disposed between the plasma display panel and the chassis base,
   wherein the heat conductive media is disposed such that a heat conductive rate is varied according to a location on the plasma display panel or the chassis base,
   wherein the heat conductive media includes a plurality of heat conductive members disposed at a predetermined distance, and
   wherein the heat conductive members are disposed in a plurality of rows in parallel with each other, a distance between adjacent heat conductive members being different according to the rows.

4. The plasma display device of claim 3 wherein the distance is increasingly increased from an initial row to a last row.

5. The plasma display device of claim 2 wherein an amount of each member is identical.

6. The plasma display device of claim 2 wherein the heat conductive members are disposed in a plurality of rows in parallel with each other, a distance between adjacent heat conductive members being identical.

7. A plasma display device comprising:
   a plasma display panel;
   a chassis base disposed in parallel with the plasma display panel; and
   a heat conductive media disposed between the plasma display panel and the chassis base,
   wherein the heat conductive media is disposed such that a heat conductive rate is varied according to a location on the plasma display panel or the chassis base,
   wherein the heat conductive media includes a plurality of heat conductive members disposed at a predetermined distance,
   wherein the heat conductive members are disposed in a plurality of rows in parallel with each other, a distance between adjacent heat conductive members being identical, and
   wherein an area of the heat conductive members is increasingly decreased from an initial row to a last row.

8. The plasma display device of claim 1 wherein the heat conductive media is formed of a layer disposed between the plasma display panel and the chassis base.

9. A plasma display device comprising:
   a plasma display panel;
   a chassis base disposed in parallel with the plasma display panel; and
   a heat conductive media disposed between the plasma display panel and the chassis base,
   wherein the heat conductive media is disposed such that a heat conductive rate is varied according to a location on the plasma display panel or the chassis base,
   wherein the heat conductive media is formed of a layer disposed between the plasma display panel and the chassis base, and
   wherein a thickness of the layer is different at one end of the plasma display panel or the chassis base than at an other end of the plasma display panel or the chassis base.

10. The plasma display device of claim 9 wherein the thickness is increasingly reduced from the one end to the other end.

11. The plasma display device of claim 1 further comprising a spacer disposed between the plasma display panel and the chassis base to maintain a space between the plasma display panel and the chassis base.

12. The plasma display device of claim 11 wherein the spacer is disposed at each corner between the plasma display panel and the chassis base.

13. The plasma display device of claim 11 wherein the spacer is formed in a band-shape disposed around the periphery between the plasma display panel and the chassis base.

14. The plasma display device of claim 11 wherein the spacer is formed of a double-faced tape.

15. A plasma display device comprising:
   a plasma display panel;
   a chassis base disposed in parallel with the plasma display panel; and
   a heat conductive media disposed between the plasma display panel and the chassis base,
   wherein the heat conductive media is disposed such that a heat conductive rate is varied according to a location on the plasma display panel or the chassis base,
   wherein a plurality of projections is formed on a surface of the chassis base on which the heat conductive media is attached.

* * * * *